(12) United States Patent
Wu et al.

(10) Patent No.: US 12,488,933 B2
(45) Date of Patent: *Dec. 2, 2025

(54) WIRELESS CHARGER HAVING THERMOELECTRIC COOLER CHIPS FOR DISSIPATING HEAT

(71) Applicant: CYNTEC CO., LTD., Hsinchu (TW)

(72) Inventors: Tsung-Chan Wu, Hsinchu County (TW); Yen-Ming Liu, Changhua County (TW); Chien-Hui Chen, Taoyuan (TW)

(73) Assignee: CYNTEC CO., LTD., Hsinchu (TW)

( * ) Notice: Subject to any disclaimer, the term of this patent is extended or adjusted under 35 U.S.C. 154(b) by 1011 days.

This patent is subject to a terminal disclaimer.

(21) Appl. No.: 17/522,925

(22) Filed: Nov. 10, 2021

(65) Prior Publication Data

US 2022/0158491 A1 May 19, 2022

Related U.S. Application Data

(60) Provisional application No. 63/113,815, filed on Nov. 13, 2020.

(51) Int. Cl.
*H02J 50/10* (2016.01)
*H01F 27/24* (2006.01)
*H01F 27/28* (2006.01)
*H01F 27/32* (2006.01)
*H01F 41/04* (2006.01)
*H01Q 7/06* (2006.01)
*H01Q 7/08* (2006.01)
*H02J 7/00* (2006.01)
*H02J 50/70* (2016.01)
*H05K 7/20* (2006.01)
*H10N 10/00* (2023.01)

(52) U.S. Cl.
CPC ......... *H01F 27/2823* (2013.01); *H01F 27/24* (2013.01); *H01F 27/32* (2013.01); *H01F 41/04* (2013.01); *H01Q 7/06* (2013.01); *H01Q 7/08* (2013.01); *H02J 7/0044* (2013.01); *H02J 50/10* (2016.02); *H02J 50/70* (2016.02); *H05K 7/20145* (2013.01); *H10N 10/00* (2023.02)

(58) Field of Classification Search
CPC ..................................................... H02J 50/10
USPC ......................................................... 320/108
See application file for complete search history.

(56) References Cited

U.S. PATENT DOCUMENTS

| 8,294,418 B2 * | 10/2012 | Hui ......................... H02J 50/12 |
| | | 320/108 |
| 11,601,015 B2 * | 3/2023 | Wu ........................ H02J 7/0042 |
| 2012/0235636 A1 * | 9/2012 | Partovi .................. H02J 7/0042 |
| | | 320/108 |

(Continued)

FOREIGN PATENT DOCUMENTS

CN 113852144 * 12/2021

*Primary Examiner* — Yalkew Fantu
(74) *Attorney, Agent, or Firm* — Min-Lee Teng (57) ABSTRACT

A wireless charger comprises atop cover; a metallic case; and a first thermoelectric cooler chip, disposed between a bottom surface of the top cover and a top surface of the metallic case to form a heat conductive path from the top cover to the metallic case via the first thermoelectric cooler chip for dissipating heat generated by an electronic device disposed on the top cover for wireless charging the electronic device.

12 Claims, 6 Drawing Sheets

(56) References Cited

U.S. PATENT DOCUMENTS

2015/0311955 A1* 10/2015 Lu .................... H04W 4/80
                                                                      455/419
2018/0124959 A1* 5/2018 Saab .................. H04B 5/79

* cited by examiner

WIRELESS CHARGER HAVING THERMOELECTRIC COOLER CHIPS FOR DISSIPATING HEAT

CROSS-REFERENCE TO RELATED APPLICATIONS

This application claims the benefit of U.S. Provisional Application Ser. No. 63/113,815 filed on Nov. 13, 2020, wherein the entirety of the Provisional Application is incorporated by reference herein.

BACKGROUND OF THE INVENTION

Field of the Invention

The invention relates to a wireless charger for charging an electronic device.

Description of the Related Art

As charging for consumer and automotive devices become more and more popular, however, there are some restrictions in placing an electronic device over the coils of a wireless charger for charging the electronic device. In addition, as speed becomes more and more important, the heat dissipation generated from the electronic device also becomes an issue.

Accordingly, the present invention proposes a better solution to overcome the above-mentioned problems.

SUMMARY OF THE INVENTION

One objective of the present invention is to provide a wireless charger for charging an electronic device, wherein a conductive path is established from the electronic device to a metallic case of the wireless charger for dissipating heat from the electronic device.

One objective of the present invention is to provide a wireless charger for charging an electronic device, wherein the top surface of the wireless charger has no holes for preventing water, liquid, or dust from entering into the inside of the wireless charger.

In one embodiment, a wireless charger is disclosed, wherein the wireless charger comprising: atop cover, comprising an insulating and heat-conducting material; a metallic case, wherein at least one conductive element is disposed therein; and a first thermoelectric cooler chip, disposed between a bottom surface of the top cover and a top surface of the metallic case to form a heat conductive path from the top cover to the metallic case via the first thermoelectric cooler chip for dissipating heat generated by an electronic device disposed on the top cover for wireless charging the electronic device.

In one embodiment, a first recess is formed in the metallic case, wherein the at least one conductive element is disposed in the first recess.

In one embodiment, the at least one conductive element comprises a plurality of coils, wherein the plurality of coils are stacked into a plurality of layers for charging the electronic device.

In one embodiment, the metallic case comprises a metallic plate, wherein the first recess is formed at the upper side of the metallic plate of the metallic case, wherein a second recess is formed at the lower side of the metallic plate of the metallic case, wherein a circuit board is disposed in the second recess of the metallic case.

In one embodiment, the metallic case has a through-opening, wherein a fan is disposed in the through-opening.

In one embodiment, the at least one conductive element comprises a coil, wherein an EMI filter comprising a metal is disposed over the coil, wherein the first thermoelectric cooler chip is disposed between a bottom surface of the EMI filter and a top surface of the metallic case to form a heat conductive path from the top cover to the metallic case via the EMI filter for dissipating heat generated by the electronic device.

In one embodiment, the EMI (Electromagnetic Interference) filter is an E-field shielding board.

In one embodiment, a shielding layer is disposed between the coil and the circuit board.

In one embodiment, the metallic plate comprises Al—Si—Cu alloy.

In one embodiment, the metallic case comprises Al.

In one embodiment, an air deflector is disposed at a lateral side of the metallic case.

In one embodiment, the at least one conductive element comprises a plurality of coils, wherein a magnetic material encapsulates the plurality of coils, and an upper cover is disposed over the magnetic material, wherein each of a bottom surface of the upper cover and a top surface of the plurality of coils is in contact with the magnetic material.

In one embodiment, a wireless charger is disclosed, the wireless charger comprising: a top cover, formed by an insulating and heat-conducting material; a metallic case, wherein at least one conductive element is disposed therein; and a high-k heat-conducting material, disposed between a bottom surface of the top cover and a top surface of the metallic case to form a heat conductive path from the top cover to the metallic case via the high-k heat conducting material for dissipating heat generated by an electronic device disposed on the top cover for wireless charging the electronic device.

In one embodiment, the high-k heat-conducting material comprises high-k heat conducting polymer.

In one embodiment, the high-k heat-conducting material comprises high-k heat-conducting metal.

In one embodiment, the plurality of coils are stacked into two or three layers for forming an active zone of fluxes for charging electronic devices.

In one embodiment, the plurality of coils are stacked into two or three layers with each layer comprising at least one coil for forming the active zone of fluxes.

In one embodiment, the plurality of coils are stacked into two or three layers with each layer comprising at least two coils for forming the active zone of fluxes.

In one embodiment, each of the two electronic devices is a mobile phone, TWS, Apple watch, etc.

In one embodiment, an EMI (Electromagnetic Interference) filter is disposed over the plurality of coils.

In one embodiment, the high-k heat-conducting material is disposed between a bottom surface of the EMI (Electromagnetic Interference) filter and a top surface of the metallic case.

In one embodiment, the EMI (Electromagnetic Interference) filter is an E-field shielding board.

In one embodiment, the metallic case comprises aluminum or aluminum alloy material. In one embodiment, the metallic plate comprises ADC12, that is, the metallic plate can have a strong mechanical strength to withstand the stress when the wireless charger 101 is under pressure, wherein the ADC12 comprises Al—Si—Cu alloy.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

The present invention discloses a wireless charger comprising a heat conductive path from the top cover to the metallic case via a thermoelectric cooler chip for dissipating heat generated by an electronic device disposed on the top cover for wireless charging the electronic device.

The present invention discloses a wireless charger comprising a heat conductive path from the top cover to the metallic case via a high-k heat conducting material for dissipating heat generated by an electronic device disposed on the top cover for wireless charging the electronic device.

Figure 1A:
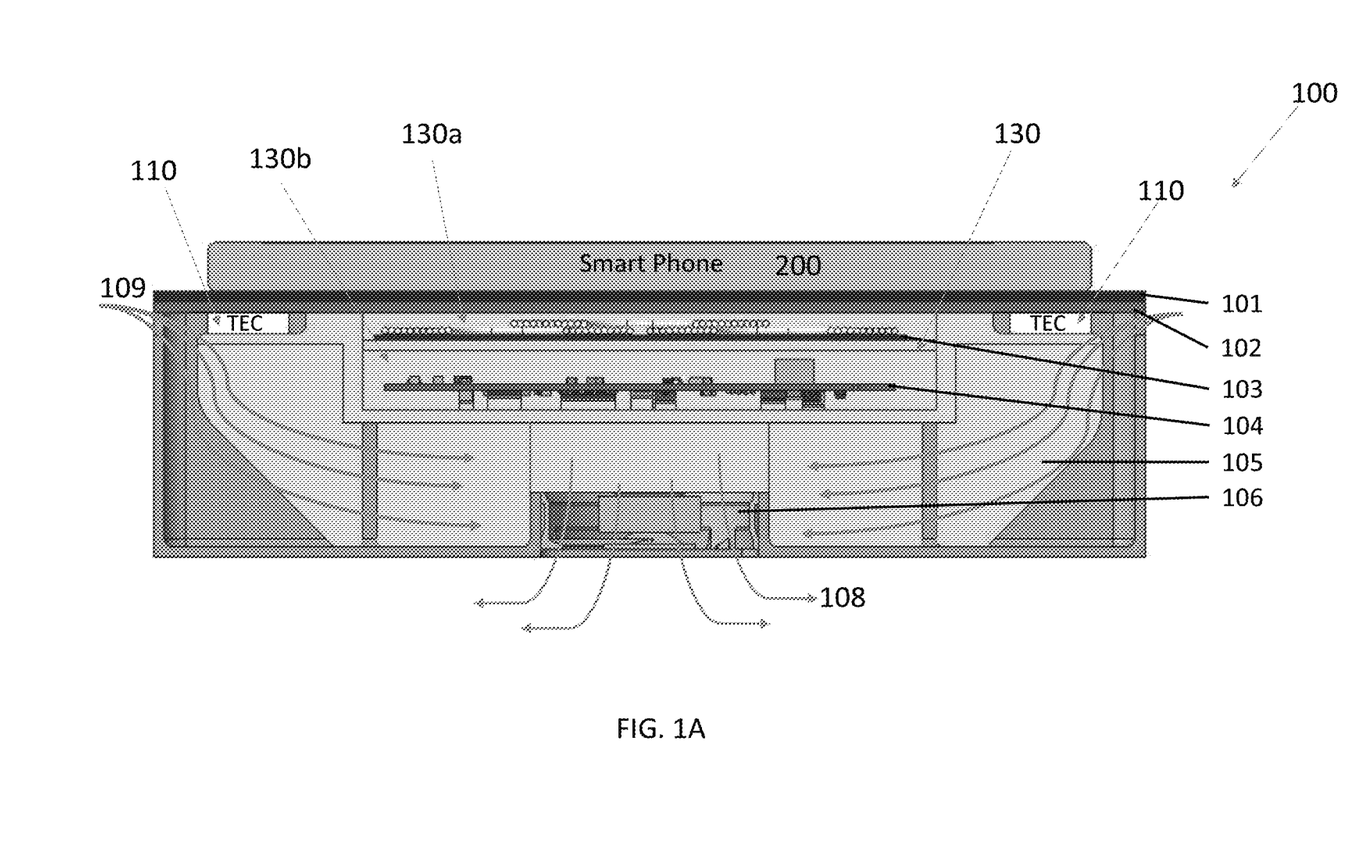
FIG. 1A is a side view of a wireless charger in accordance with one embodiment of the invention.

FIG. 1A is a side view of a wireless charger 100 in accordance with one embodiment of the invention, wherein the wireless charger 100 comprises: a top cover 101, comprising an insulating and heat-conducting material; a metallic case 105, wherein at least one conductive element 103 is disposed therein; and a first thermoelectric cooler chip 110, disposed between a bottom surface of the top cover 101 and a top surface of the metallic case 105 to form a heat conductive path from the top cover 101 to the metallic case 105 via the first thermoelectric cooler chip 110 for dissipating heat generated by an electronic device 200 disposed on the top cover for wireless charging the electronic device 200.

In one embodiment, the top surface of the top cover 101 of the wireless charger 100 has no holes for preventing water, liquid, or dust from entering into the inside of the wireless charger.

In one embodiment, a first recess 130a is formed in the metallic case 105, wherein the at least one conductive element 103a is disposed in the first recess 130a.

In one embodiment, the at least one conductive element 103a comprises a plurality of coils, wherein the plurality of coils are stacked into a plurality of layers for charging the electronic device.

In one embodiment, the metallic case comprises a metallic plate 130, wherein the first recess 130a is formed at the upper side of the metallic plate of the metallic case, wherein a second recess 130b is formed at the lower side of the metallic plate 130 of the metallic case 105, wherein a circuit board 104 is disposed in the second recess 130b of the metallic case 105.

In one embodiment, the metallic case 105 has a through-opening, wherein a fan 106 is disposed in the through-opening to cause airflow 108 from an inlet 109 to outside of the wireless charger 100.

In one embodiment, the at least one conductive element comprises a coil, wherein an EMI filter 102 is disposed over the coil, wherein the first thermoelectric cooler chip 110 is disposed between a bottom surface of the EMI filter 102 and a top surface of the metallic case 105 to form a heat conductive path from the top cover to the metallic case 105 via the EMI filter 102 for dissipating heat generated by the electronic device 200.

In one embodiment, the EMI filter is made of metal.

In one embodiment, the EMI filter is made of copper.

In one embodiment, the EMI (Electromagnetic Interference) filter is an E-field shielding board.

In one embodiment, the E-field shielding board is made of PCB and copper foil trace.

In one embodiment, a shielding layer is disposed between the coil and the circuit board.

In one embodiment, the metallic plate comprises Al—Si—Cu alloy.

In one embodiment, the metallic case comprises Al.

In one embodiment, an air deflector is disposed at a lateral side of the metallic case.

In one embodiment, the at least one conductive element comprises a plurality of coils, wherein a magnetic material encapsulates the plurality of coils, and an upper cover is disposed over the magnetic material, wherein each of a bottom surface of the upper cover and a top surface of the plurality of coils is in contact with the magnetic material.

Figure 1B:
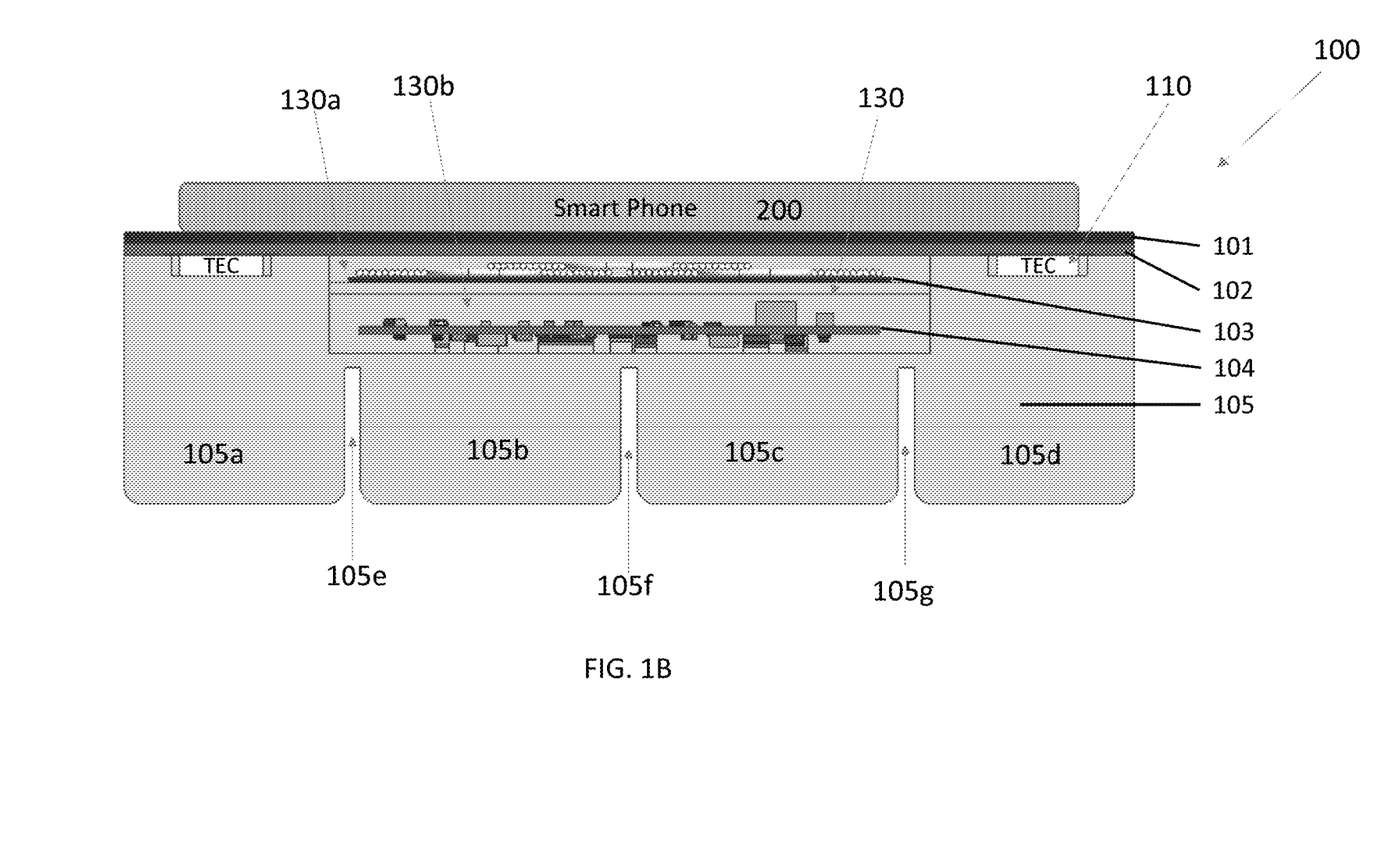
FIG. 1B is a side view of a wireless charger in accordance with one embodiment of the invention.

FIG. 1B is a side view of a wireless charger 100 in accordance with one embodiment of the invention, wherein in one embodiment, the metallic case 105 comprises a plurality of portions 105a, 105b, 105c, 105d, wherein every two adjacent portions has a horizontal gap 105e, 105f, 105g therebetween.

Figure 1C:
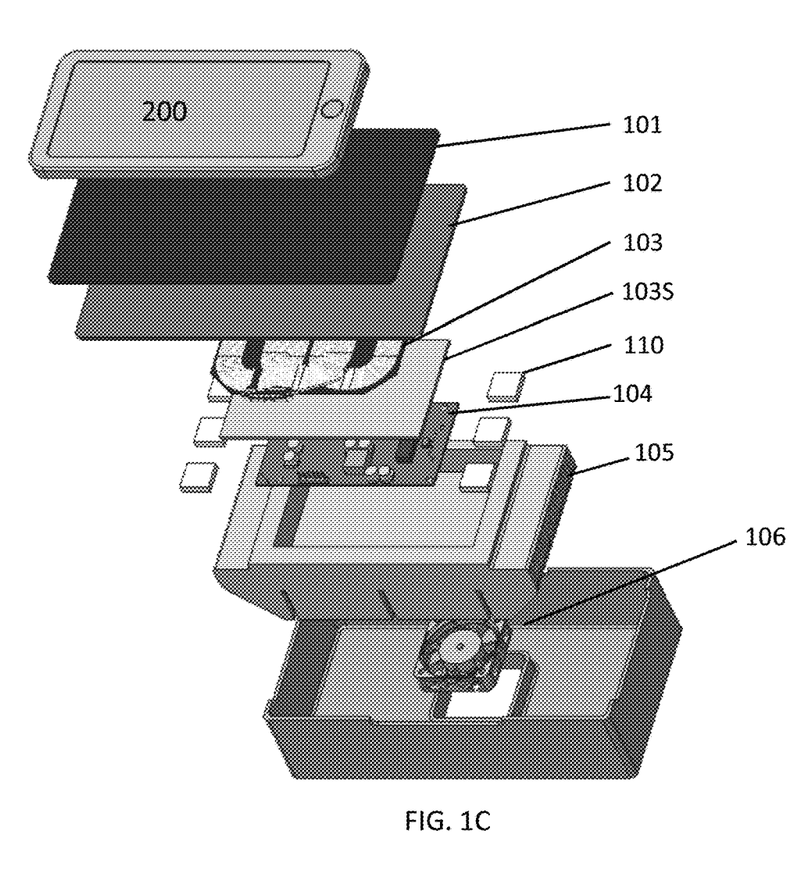
FIG. 1C a exploded view of a wireless charger in accordance with one embodiment of the invention.

FIG. 1C is an exploded view of a wireless charger 100 in accordance with one embodiment of the invention, wherein a shielding layer 103S is disposed under the coils 103.

Figure 1D:
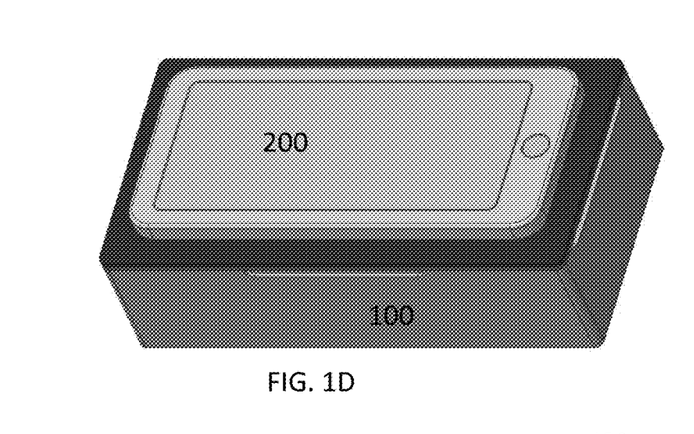
FIG. 1D a perspective view of a wireless charger in accordance with one embodiment of the invention.

FIG. 1D is a perspective view of a wireless charger 100 in accordance with one embodiment of the invention, wherein a mobile phone is disposed on the top surface of the wireless charger 100 for charging the mobile phone.

Figure 1E:
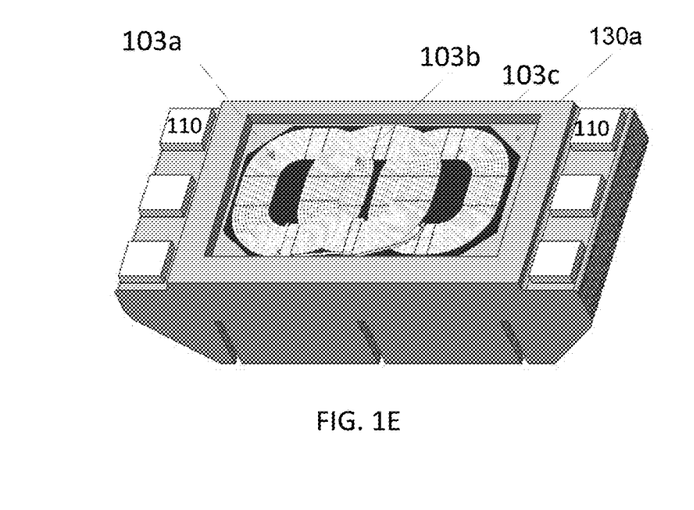
FIG. 1E a top view of a wireless charger in accordance with one embodiment of the invention.

FIG. 1E is a top view of a wireless charger 100 in accordance with one embodiment of the invention, wherein in one embodiment, the at least one conductive element comprises a plurality of coils 103a, 103b, 103c.

Figure 2A:
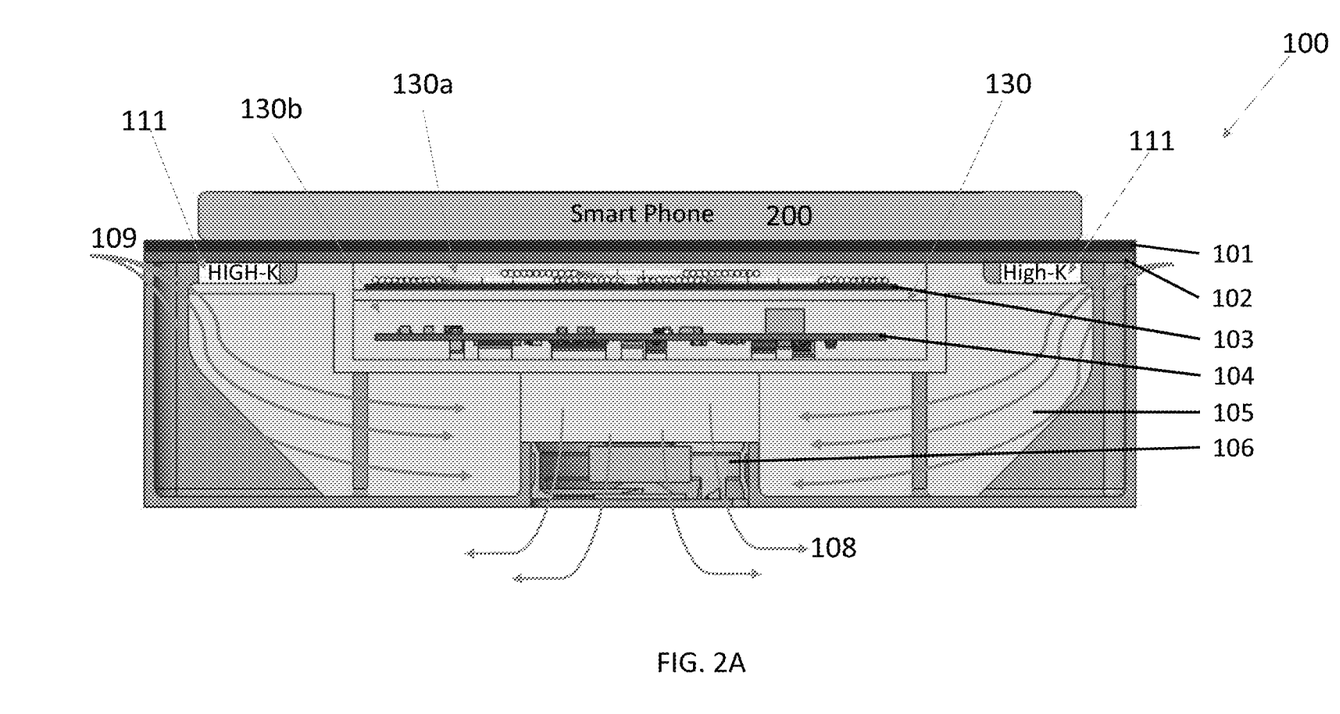
FIG. 2A is a side view of a wireless charger in accordance with one embodiment of the invention.

FIG. 2A is a side view of a wireless charger 100 in accordance with one embodiment of the invention, wherein the wireless charger 100 comprises: a top cover 101, comprising an insulating and heat-conducting material; a metallic case 105, wherein at least one conductive element 103 is disposed therein; and a high-k heat-conducting material 111, disposed between a bottom surface of the top cover 101 and a top surface of the metallic case 105 to form a heat conductive path from the top cover 101 to the metallic case 105 via the heat-conducting material 111 for dissipating heat generated by an electronic device 200 disposed on the top cover for wireless charging the electronic device 200.

Please note that "k" in the high-k heat-conducting material 111 refers to the thermal conductivity, k, a measure of the material's ability to heat conduction. To facilitate the heat conduction to the metallic case, only the material with k much higher than 237 W/mK (thermal conductivity of Al metallic case) can be used. In other words, the high-k heat-conducting material is defined as a material with a thermal conductivity equal to or greater than 237 W/mK.

In one embodiment, the top surface of the top cover 101 of the wireless charger 100 has no holes for preventing water, liquid, or dust from entering into the inside of the wireless charger.

In one embodiment, the high-k heat-conducting polymer.

In one embodiment, the high-k heat-conducting metal.

In one embodiment, the high-k heat-conducting material comprises Cu.

In one embodiment, the high-k heat conducting material comprises graphene.

In one embodiment, a first recess is formed in the metallic case, wherein the at least one conductive element is disposed in the first recess.

In one embodiment, the at least one conductive element comprises a plurality of coils, wherein the plurality of coils are stacked into a plurality of layers for charging the electronic device.

In one embodiment, the metallic case comprises a metallic plate, wherein the first recess is formed at the upper side of the metallic plate of the metallic case, wherein a second recess is formed at the lower side of the metallic plate of the metallic case, wherein a circuit board is disposed in the second recess of the metallic case.

In one embodiment, the metallic case has a through-opening, wherein a fan is disposed in the through-opening.

In one embodiment, the at least one conductive element comprises a coil, wherein an EMI filter is disposed over the coil, wherein the high-k heat-conducting material is disposed between a bottom surface of the EMI filter and a top surface of the metallic case to form a heat conductive path from the top cover to the metallic case via the EMI filter for dissipating heat generated by the electronic device.

In one embodiment, the EMI (Electromagnetic Interference) filter is an E-field shielding board.

In one embodiment, the E-field shielding board is made of PCB and copper foil trace.

In one embodiment, the metallic plate comprises Al—Si—Cu alloy.

In one embodiment, the metallic case comprises Al.

In one embodiment, an air deflector is disposed at a lateral side of the metallic case.

In one embodiment, the at least one conductive element comprises a plurality of coils, wherein a magnetic material encapsulates the plurality of coils, and an upper cover is disposed over the magnetic material, wherein each of a bottom surface of the upper cover and a top surface of the plurality of coils is in contact with the magnetic material.

In one embodiment, the at least one conductive element comprises a plurality of coils, wherein the plurality of coils are stacked into a plurality of layers with each layer comprising at least two coils, wherein at least two electronic devices are capable of being placed over the plurality of coils for charging the at least two electronic devices.

Figure 2B:
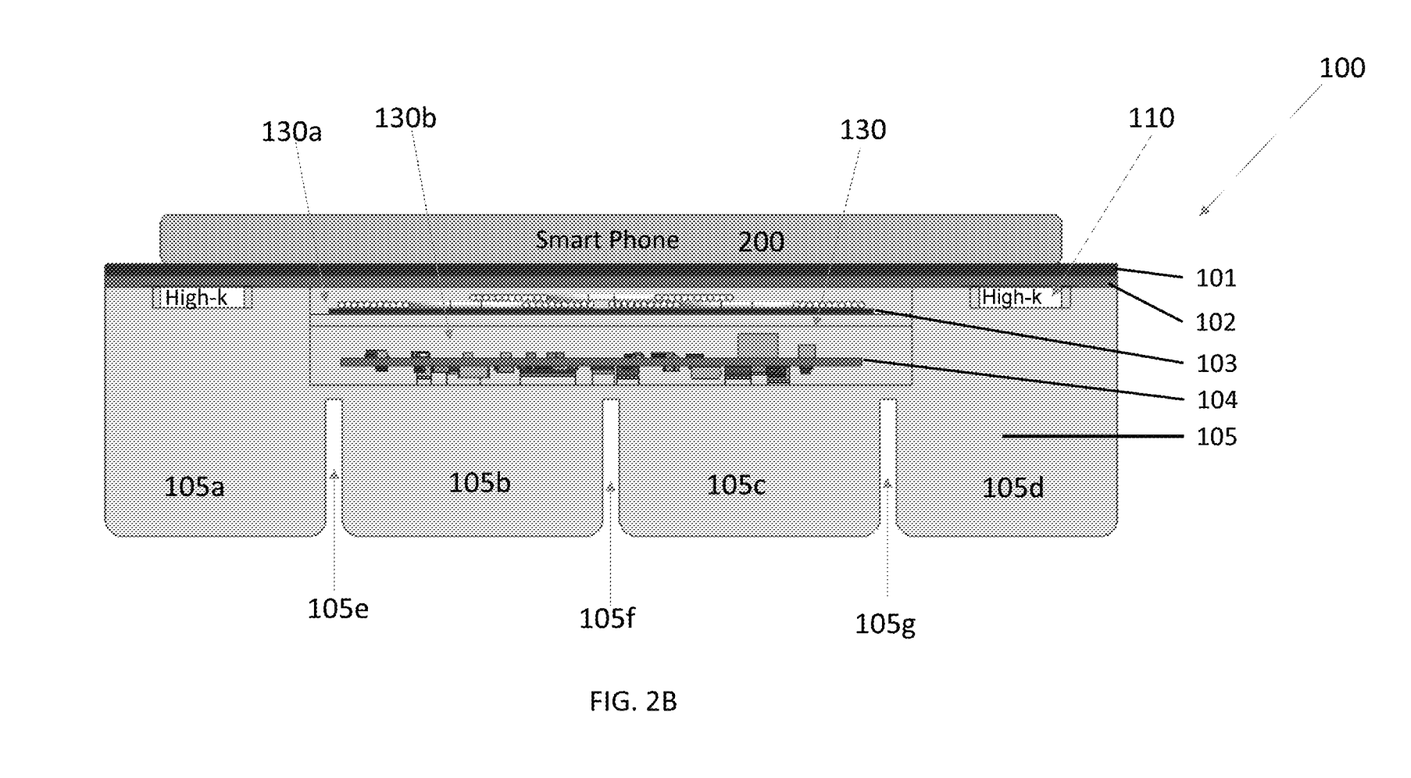
FIG. 2B is a side view of a wireless charger in accordance with one embodiment of the invention.

FIG. 2B is a side view of a wireless charger 100 in accordance with one embodiment of the invention, wherein in one embodiment, the metallic case 105 comprises a plurality of portions 105a, 105b, 105c, 105d, wherein every two adjacent portions has a horizontal gap 105e, 105f, 105g therebetween.

Figure 2C:
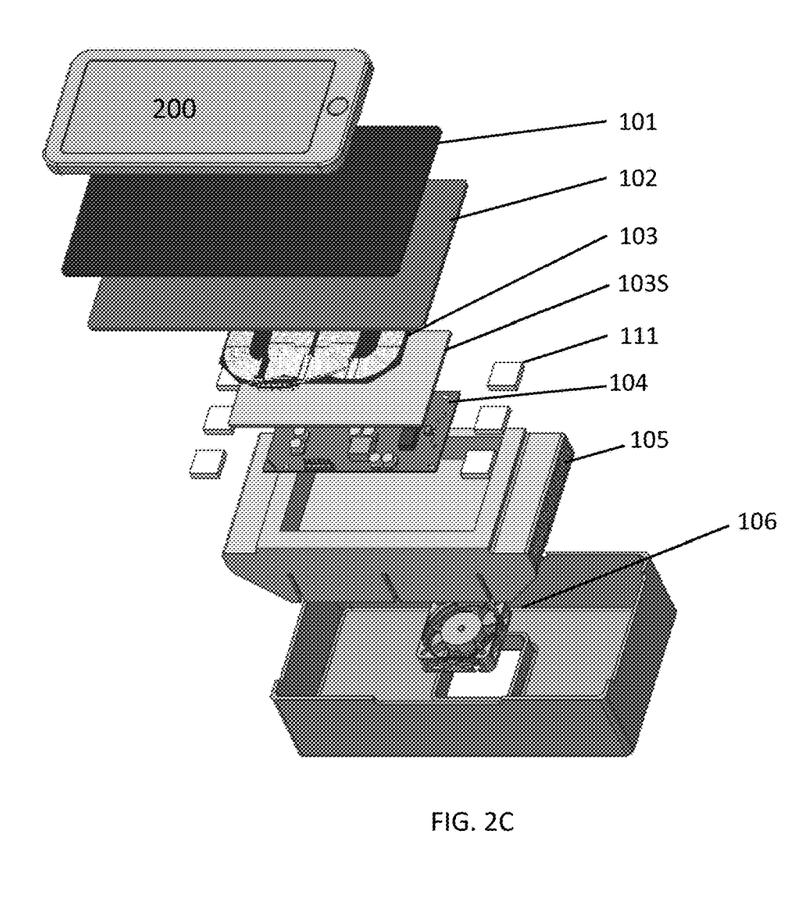
FIG. 2C a exploded view of a wireless charger in accordance with one embodiment of the invention.

FIG. 2C is an exploded view of a wireless charger 100 in accordance with one embodiment of the invention.

Figure 2D:
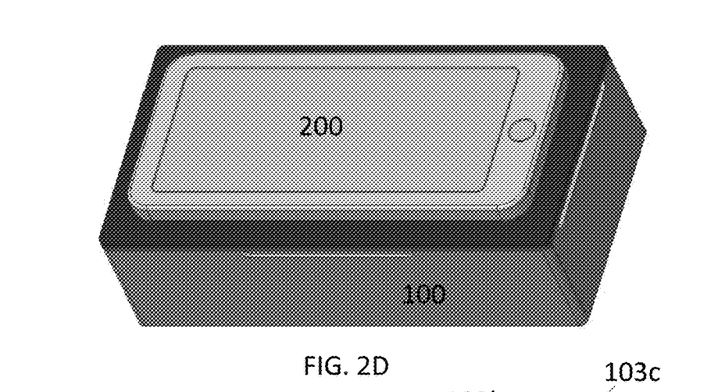
FIG. 2D a perspective view of a wireless charger in accordance with one embodiment of the invention.

FIG. 2D is a perspective view of a wireless charger 100 in accordance with one embodiment of the invention, wherein a mobile phone is disposed on the top surface of the wireless charger 100 for charging the mobile phone.

Figure 2E:
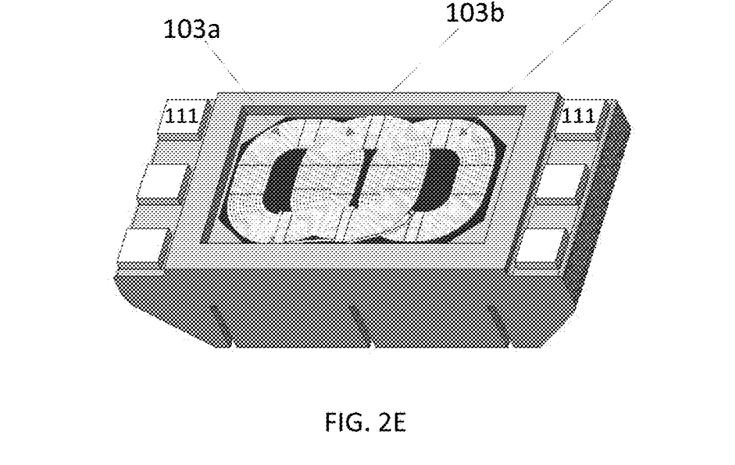
FIG. 2E a top view of a wireless charger in accordance with one embodiment of the invention.

FIG. 2E is a top view of a wireless charger 100 in accordance with one embodiment of the invention, wherein in one embodiment, the at least one conductive element comprises a plurality of coils 103a, 103b, 103c.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A wireless charger, comprising:
   a top cover, comprising an insulating and heat-conducting material;
   a metallic case, wherein at least one conductive element is disposed therein;
   a first thermoelectric cooler chip, disposed between a bottom surface of the top cover and a top surface of the metallic case to form a first heat conductive path from the top cover to the metallic case via the first thermoelectric cooler chip for dissipating heat generated by an electronic device disposed on the top cover for wireless charging the electronic device; and
   a second thermoelectric cooler chip, disposed between the bottom surface of the top cover and the top surface of the metallic case to form a second heat conductive path from the top cover to the metallic case via the second thermoelectric cooler chip for dissipating heat generated by the electronic device disposed on the top cover for wireless charging the electronic device.

2. The wireless charger of claim 1, wherein a first recess is formed in the metallic case, wherein the at least one conductive element is disposed in the first recess.

3. The wireless charger of claim 2, wherein the at least one conductive element comprises a plurality of coils disposed in the first recess, wherein the plurality of coils are stacked into a plurality of layers for charging the electronic device.

4. The wireless charger of claim 2, wherein the metallic case comprises a metallic plate, wherein the first recess is formed at the upper side of the metallic plate of the metallic case, wherein a second recess is formed at the lower side of the metallic plate of the metallic case, wherein a circuit board is disposed in the second recess of the metallic case.

5. The wireless charger of claim 4, wherein the metallic plate comprises Al—Si—Cu alloy.

6. The wireless charger of claim 1, wherein the metallic case has a through-opening, wherein a fan is disposed in the through-opening.

7. The wireless charger of claim 1, wherein the at least one conductive element comprises a coil, wherein an EMI filter comprising a metal is disposed between the top cover and the coil, wherein the first thermoelectric cooler chip is disposed between a bottom surface of the EMI filter and a top surface of the metallic case to form a heat conductive path from the top cover to the metallic case via the EMI filter for dissipating heat generated by the electronic device.

8. The wireless charger of claim 7, wherein a shielding layer is disposed under the coil.

9. The wireless charger of claim 1, wherein the metallic case comprises Al.

10. The wireless charger of claim 1, wherein an air deflector is disposed at a lateral side of the metallic case.

11. The wireless charger of claim 1, wherein the at least one conductive element comprises a plurality of coils, wherein a magnetic material encapsulates the plurality of coils, wherein the plurality of coils are in contact with the magnetic material.

12. The wireless charger of claim 1, wherein the at least one conductive element comprises a coil, wherein the first thermoelectric cooler chip and the second thermoelectric cooler chip are located at two opposite sides of the coil.

* * * * *